(12) United States Patent
Ramachandran et al.

(10) Patent No.: US 8,426,300 B2
(45) Date of Patent: Apr. 23, 2013

(54) SELF-ALIGNED CONTACT FOR REPLACEMENT GATE DEVICES

(75) Inventors: Ravikumar Ramachandran, Pleasantville, NY (US); Ying Li, Newburgh, NY (US); Richard S. Wise, Newburgh, NY (US)

(73) Assignee: International Business Machines Corporation, Armonk, NY (US)

(*) Notice: Subject to any disclaimer, the term of this patent is extended or adjusted under 35 U.S.C. 154(b) by 279 days.

(21) Appl. No.: 12/958,607

(22) Filed: Dec. 2, 2010

(65) Prior Publication Data
US 2012/0139061 A1 Jun. 7, 2012

(51) Int. Cl.
*H01L 21/00* (2006.01)
(52) U.S. Cl.
USPC .......................... 438/586; 438/197; 438/216
(58) Field of Classification Search .................. 438/586, 438/197, 216
See application file for complete search history.

(56) References Cited

U.S. PATENT DOCUMENTS

| | | | | |
|---|---|---|---|---|
| 6,607,950 B2* | 8/2003 | Henson et al. | | 438/197 |
| 7,157,378 B2* | 1/2007 | Brask et al. | | 438/704 |
| 7,397,087 B2* | 7/2008 | Chinthakindi et al. | | 257/350 |
| 7,446,036 B1* | 11/2008 | Bolom et al. | | 438/640 |
| 7,485,510 B2* | 2/2009 | Zhu et al. | | 438/157 |
| 7,670,497 B2 | 3/2010 | Fitzsimmons et al. | | |
| 7,704,830 B2* | 4/2010 | Rao et al. | | 438/257 |
| 7,723,174 B2* | 5/2010 | Waite et al. | | 438/216 |
| 7,838,356 B2* | 11/2010 | Kirkpatrick et al. | | 438/199 |
| 8,021,942 B2* | 9/2011 | Wei et al. | | 438/216 |
| 8,114,746 B2* | 2/2012 | Wei et al. | | 438/296 |
| 8,183,139 B2* | 5/2012 | Marxsen et al. | | 438/586 |
| 8,198,152 B2* | 6/2012 | Beyer et al. | | 438/199 |
| 8,232,607 B2* | 7/2012 | Edge et al. | | 257/382 |
| 2006/0027878 A1* | 2/2006 | Chinthakindi et al. | | 257/379 |
| 2008/0079037 A1* | 4/2008 | Zhu et al. | | 257/288 |
| 2008/0303067 A1* | 12/2008 | Rao et al. | | 257/288 |
| 2009/0057769 A1* | 3/2009 | Wei et al. | | 257/369 |
| 2009/0321843 A1* | 12/2009 | Waite et al. | | 257/369 |
| 2011/0151635 A1* | 6/2011 | Liu et al. | | 438/301 |
| 2011/0193144 A1* | 8/2011 | Sun et al. | | 257/288 |
| 2011/0210398 A1* | 9/2011 | Beyer et al. | | 257/368 |
| 2011/0241124 A1* | 10/2011 | Kurz et al. | | 257/379 |
| 2011/0266633 A1* | 11/2011 | Beyer et al. | | 257/379 |
| 2011/0269276 A1* | 11/2011 | Kwon et al. | | 438/199 |
| 2011/0269303 A1* | 11/2011 | Marxsen et al. | | 438/586 |
| 2012/0001263 A1* | 1/2012 | Richter et al. | | 257/368 |
| 2012/0068237 A1* | 3/2012 | Booth et al. | | 257/296 |
| 2012/0126295 A1* | 5/2012 | Edge et al. | | 257/288 |
| 2012/0139061 A1* | 6/2012 | Ramachandran et al. | | 257/410 |
| 2012/0139062 A1* | 6/2012 | Yuan et al. | | 257/411 |
| 2012/0153398 A1* | 6/2012 | Baars et al. | | 257/369 |
| 2012/0153405 A1* | 6/2012 | Heinrich et al. | | 257/410 |
| 2012/0211808 A1* | 8/2012 | Wei et al. | | 257/288 |
| 2012/0211837 A1* | 8/2012 | Baars et al. | | 257/368 |

* cited by examiner

*Primary Examiner* — Laura Menz
(74) *Attorney, Agent, or Firm* — Scully, Scott, Murphy & Presser, P.C.; H. Daniel Schnurmann

(57) ABSTRACT

A conductive top surface of a replacement gate stack is recessed relative to a top surface of a planarization dielectric layer by at least one etch. A dielectric capping layer is deposited over the planarization dielectric layer and the top surface of the replacement gate stack so that the top surface of a portion of the dielectric capping layer over the replacement gate stack is vertically recessed relative to another portion of the dielectric layer above the planarization dielectric layer. The vertical offset of the dielectric capping layer can be employed in conjunction with selective via etch processes to form a self-aligned contact structure.

12 Claims, 14 Drawing Sheets

US 8,426,300 B2

SELF-ALIGNED CONTACT FOR REPLACEMENT GATE DEVICES

BACKGROUND

The present disclosure relates to semiconductor structures, and particularly to a metal-oxide-semiconductor field effect transistor (MOSFET) having a self-aligned contact structure and methods of manufacturing the same.

As semiconductor devices shrink in each generation of semiconductor technology, formation of contact structures to source and drain regions of a field effect transistor become challenging because such contact structures not only need to provide reliable electrical contact to the source and drain regions, but also need to avoid electrically shorting to other components such as the gate electrode of the field effect transistor. Since the etch chemistry employed for the anisotropic etch process remains the same while the lateral dimension of the dielectric gate spacer shrinks with the scaling of semiconductor devices, the likelihood of overlay variations during lithographic processes causing formation of contact structures that electrically short a source/drain region to a gate conductor of a field effect transistor increases in each generation.

Nonetheless, contact structures to source and drain regions must avoid electrically shorting to gate conductors to provide a functional field effect transistor. Thus, the possibility of electrically shorting source/drain regions to a gate conductor of a field effect transistor is a significant concern for product yield and reliability purposes.

BRIEF SUMMARY

A conductive top surface of a replacement gate stack is recessed relative to a top surface of a planarization dielectric layer by at least one etch. A dielectric capping layer is deposited over the planarization dielectric layer and the top surface of the replacement gate stack so that the top surface of a portion of the dielectric capping layer over the replacement gate stack is vertically recessed relative to another portion of the dielectric layer above the planarization dielectric layer. The vertical offset of the dielectric capping layer can be employed in conjunction with selective via etch processes to form a self-aligned contact structure.

According to an aspect of the present disclosure, a method of forming a semiconductor structure is provided, which includes: forming a gate electrode and a planarization dielectric layer on a semiconductor substrate, wherein a top metallic surface of the gate electrode is coplanar with a top surface of the planarization dielectric layer; recessing a top surface of the gate electrode relative to the top surface of the planarization dielectric layer; forming an etch stop layer contiguously on the recessed top surface of the gate electrode and on the top surface of the planarization dielectric layer, wherein the etch stop layer includes a first portion located on the planarization dielectric layer and a second portion located on the gate electrode and having a vertically offset bottom surface relative to an interface between the planarization dielectric layer and the first portion; forming a contact-level dielectric layer over the etch stop layer; and forming a via hole extending at least through the contact-level dielectric layer, the first portion of the etch stop layer, and a portion of the planarization dielectric layer, wherein the via hole is vertically spaced from the gate electrode by the second portion of the etch stop layer.

According to another aspect of the present disclosure, a semiconductor structure is provided, which includes: a gate electrode located on a semiconductor substrate; a planarization dielectric layer laterally surrounding the gate electrode, wherein a top surface of the gate electrode is recessed relative to a top surface of the planarization dielectric layer; an etch stop layer contiguously located on the recessed top surface of the gate electrode and the top surface of the planarization dielectric layer, wherein the etch stop layer includes a first portion located on the planarization dielectric layer and a second portion located on the gate electrode and having a vertically offset bottom surface relative to an interface between the planarization dielectric layer and the first portion; a contact-level dielectric layer overlying the planarization dielectric layer; and a contact via structure extending through the contact-level dielectric layer, the etch stop layer, and the planarization dielectric layer, wherein a portion of the contact via structure overlies the gate electrode and is vertically spaced by the second portion of the etch stop layer.

DETAILED DESCRIPTION

Figure 1:
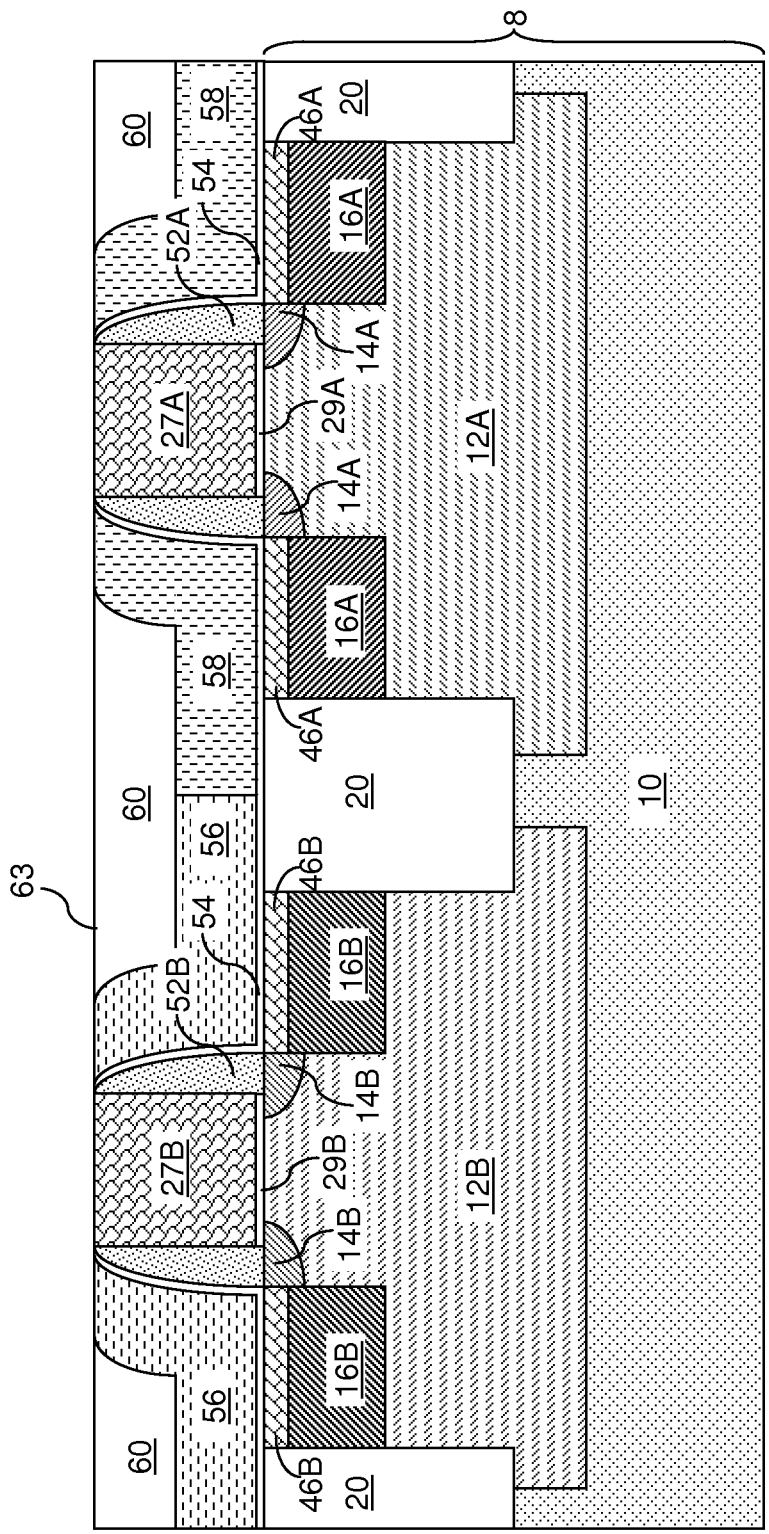
FIG. 1 is vertical cross-sectional view of an exemplary semiconductor structure after formation of disposable gate structures and formation of a planar dielectric surface on a planarization dielectric layer according to an embodiment of the present disclosure.

As stated above, the present disclosure, which relates to semiconductor structures having dual work function metal gates and a high-k gate dielectric, and methods of manufacturing the same, will now be described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

A disposable dielectric layer and a disposable gate material layer are deposited and lithographically patterned to form disposable gate structures. For example, the disposable gate structures may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the second conductivity type well 12A, and the second disposable gate structure (29B, 27B) is formed over the first conductivity type well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

Dopants of the first conductivity type are implanted into portions of the second conductivity type well 12A that are not covered by the first disposable gate structure (29A, 27A) to form first source and drain extension regions 14A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) to form second source and drain extension regions 14B. The second conductivity type well 12A can be masked by a photoresist (not shown) during the implantation of the second conductivity type dopants to prevent implantation of the second conductivity type dopants therein.

Dielectric gate spacers are formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants of the first conductivity type are implanted into portions of the second conductivity type well 12A that are not covered by the first disposable gate structure (29A, 27A) and the first dielectric gate spacer 52A to form first source and drain regions 16A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) and the second dielectric gate spacer 52B to form second source and drain regions 16B. The second conductivity type well 12A can be masked by a photoresist (not shown) during the implantation of the second conductivity type dopants to prevent implantation of the second conductivity type dopants therein.

In some embodiments, the first source and drain regions 16A and/or the second source and drain regions 16B can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B between the first source and drain extension regions 14A and/or between the second source and drain extension regions 14B.

First metal semiconductor alloy portions 46A and second metal semiconductor alloy portions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second source and drain regions (16A, 16B) include silicon.

Optionally, a dielectric liner 54 may be deposited over the metal semiconductor alloy portions 54, the first and second disposable gate structures (29A, 27A, 29B, 27B), and the first and second dielectric gate spacers (52A, 52B). The dielectric liner 54 can include a dielectric material such as silicon oxide, silicon oxynitride, silicon nitride, or a combination thereof. A first type stress-generating liner 58 and a second type stress-generating liner 56 can be formed over the first disposable gate structure (29A, 27A) and the second disposable gate structure (29B, 27B), respectively. The first type stress-generating liner 58 and/or the second type stress-generating liner 56 can be employed to apply uniaxial or biaxial lateral stress to a first channel region, which is the portion of the second conductivity type well 12A between the first source and drain extension regions 14A, and/or to a second channel region, which is the portion of the first conductivity type well 12B between the second source and drain extension regions 14B, respectively. In one embodiment, one of the first type stress-generating liner 58 and the second type stress-generating liner 56 applies a compressive stress if underlying source and drain regions (i.e., the first source and drain regions 16A or the second source and drain regions 16B) are p-doped regions, and the other of the first type stress-generating liner 58 or the second type stress-generating liner 56 applies a tensile stress if underlying source and drain regions (i.e., the second source and drain regions 16B and the first source and drain regions 16A) are n-doped regions. The first type stress-generating liner 58 and the second type stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first type stress-generating liner 58 and/or the second type stress-generating liner 56, if present, or over the metal semiconductor alloy portions 54, the first and second disposable gate structures (29A, 27A, 29B, 27B), and the first and second dielectric gate spacers (52A, 52B) if (a) stress-generating liner(s) is/are not present. The planarization dielectric layer 60 can be formed by depositing a dielectric material, which can be selected from undoped silicate glass (USG), doped silicate glass, silicon nitride, organosilicate glass (OSG), undoped silicon oxynitride, and doped silicon oxynitride. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first type stress-generating liner 58 and/or the second type stress-generating liner 56 (if present), and the dielectric liner 54 (if present) are planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

In one embodiment, the first conductivity type is p-type and the second conductivity type is n-type. The first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. Correspondingly, the first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an second field effect transistor. The first type stress-generating liner 58 can apply a tensile stress to the first channel, and the second type stress-generating liner 56 can apply a compressive stress to the second channel.

In another embodiment, the first conductivity type is n-type and the second conductivity type is p-type. The first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. Correspondingly, the first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a first field effect transistor. The first type stress-generating liner 58 can apply a compressive stress to the first channel, and the second type stress-generating liner 56 can apply a tensile stress to the second channel.

Figure 2:
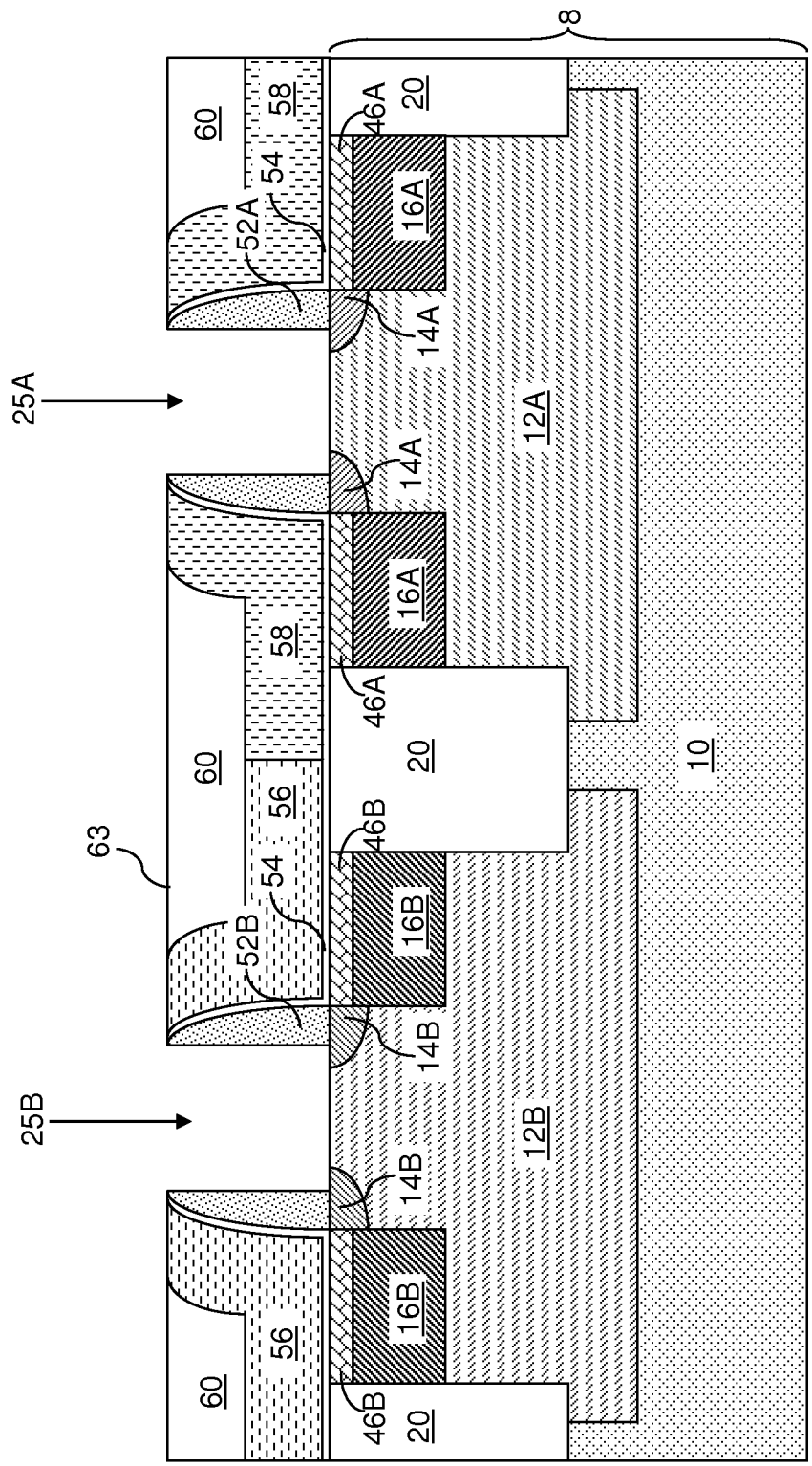
FIG. 2 is a vertical cross-sectional view of the exemplary semiconductor structure of FIG. 1 after removal of the disposable gate structures.

Referring to FIG. 2, the first disposable gate structure (29A, 27A) and the second disposable gate structure (29B, 27B) are removed by at least one etch. The at least one etch can be a recess etch, which can be an isotropic etch or anisotropic etch. The etch employed to remove the first and second disposable gate material portions (27A, 27B) is preferably selective to the dielectric materials of the planarization dielectric layer 60, the first type stress-generating liner 58 and/or the second type stress-generating liner 56 (if present), and the first and second dielectric gate spacers (52A, 52B). Optionally, one or both of the dielectric portions (29A, 29B) can be left by etch selective to these layers. The disposable gate structures (29A, 27A, 29B, 27B) are recessed below the planar dielectric surface 63 and to expose the semiconductor surfaces above the first channel and the second channel to form gate cavities (25A, 25B) over the semiconductor substrate 8.

Optionally, a first semiconductor-element-containing dielectric layer 31A can be formed on the exposed surface of the second conductivity type well 12A by conversion of the exposed semiconductor material into a dielectric material, and a second semiconductor-element-containing dielectric layer 31B can be formed on the exposed surface of the first conductivity type well 12B by conversion of the exposed semiconductor material into the dielectric material. The formation of the semiconductor-element-containing dielectric layers (31A, 31B) can be effected by thermal conversion or plasma treatment. If the semiconductor material of the second conductivity type well 12A and the first conductivity type well 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon.

Figure 3:
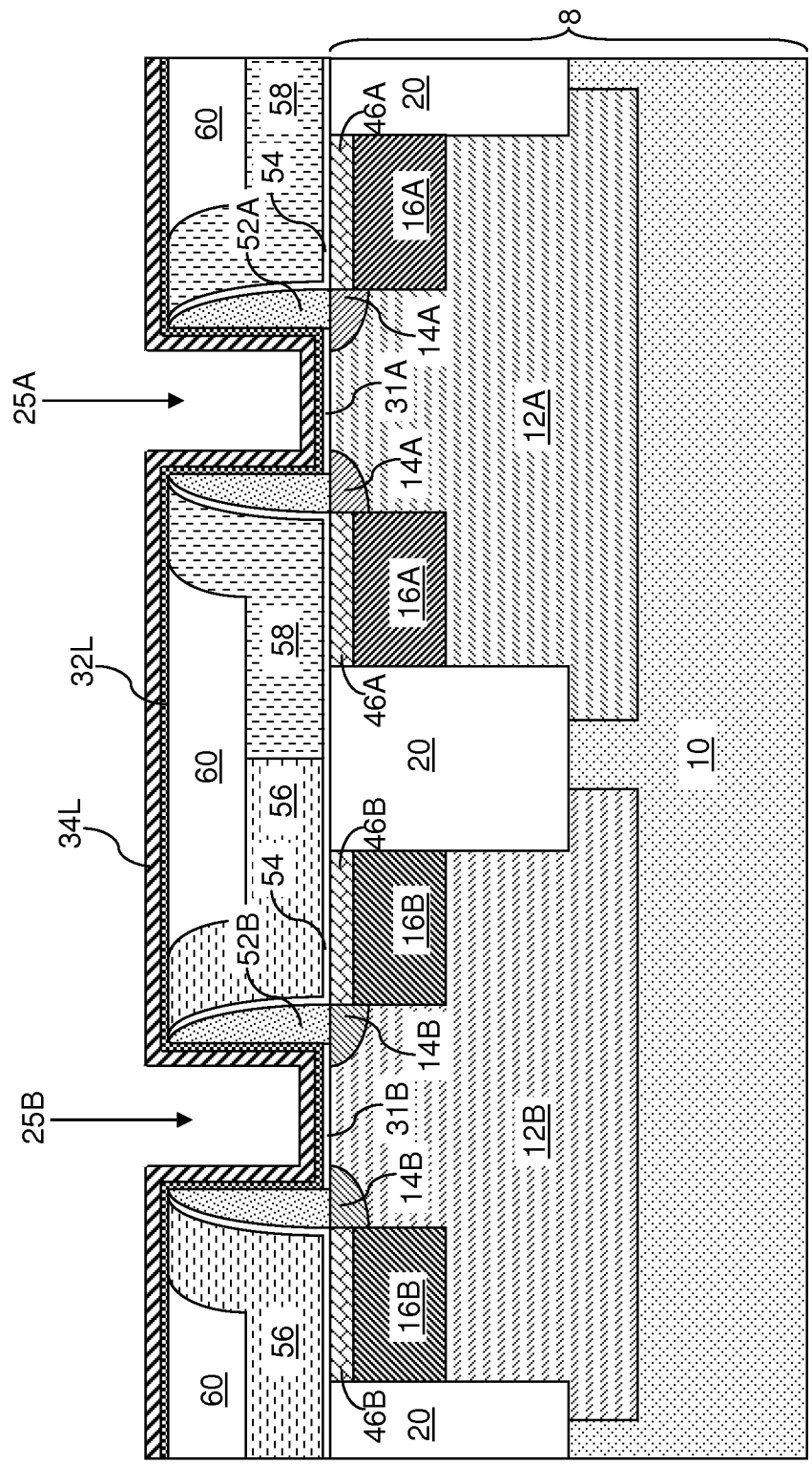
FIG. 3 is a vertical cross-sectional view of the exemplary semiconductor structure of FIG. 2 after formation of a first-type work function material layer.

Referring to FIG. 3, a contiguous gate dielectric layer 32L and a first-type work function metal layer 34L including a first metal having a first work function are sequentially formed for form a stack, from bottom to top, of the contiguous gate dielectric layer 32L and the first-type work function metal layer 34L. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm.

The first-type work function metal layer 34L includes a first metal, which has a first work function. The first metal of the first-type work function metal layer 34L is selected to optimize the performance of a transistor to be subsequently formed employing the first source and drain extension regions 14A, the first source and drain regions 16A, and the second conductivity type well 12A.

In one embodiment, the first conductivity type is p-type and the semiconductor material of the second conductivity type well 12A includes n-doped silicon, and the first-type work function metal layer 34L includes a silicon valence band edge metals such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. For example, the first-type work function metal layer 34L can be a layer of TiN.

In another embodiment, the first conductivity type is n-type and the semiconductor material of the second conductivity type well 12A includes p-doped silicon, and the first-type work function metal layer 34L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV. For example, the first-type work function metal layer 34L can be a layer of TiAl.

The first-type work function metal layer 34L can be formed, for example, by physical vapor deposition, chemical vapor deposition, or atomic layer deposition (ALD). The thickness of the first-type work function metal layer 34L is typically set at a value from 1 nm to 30 nm, and more typically, from 2 nm to 10 nm, although lesser and greater thicknesses can also be employed.

Figure 4:
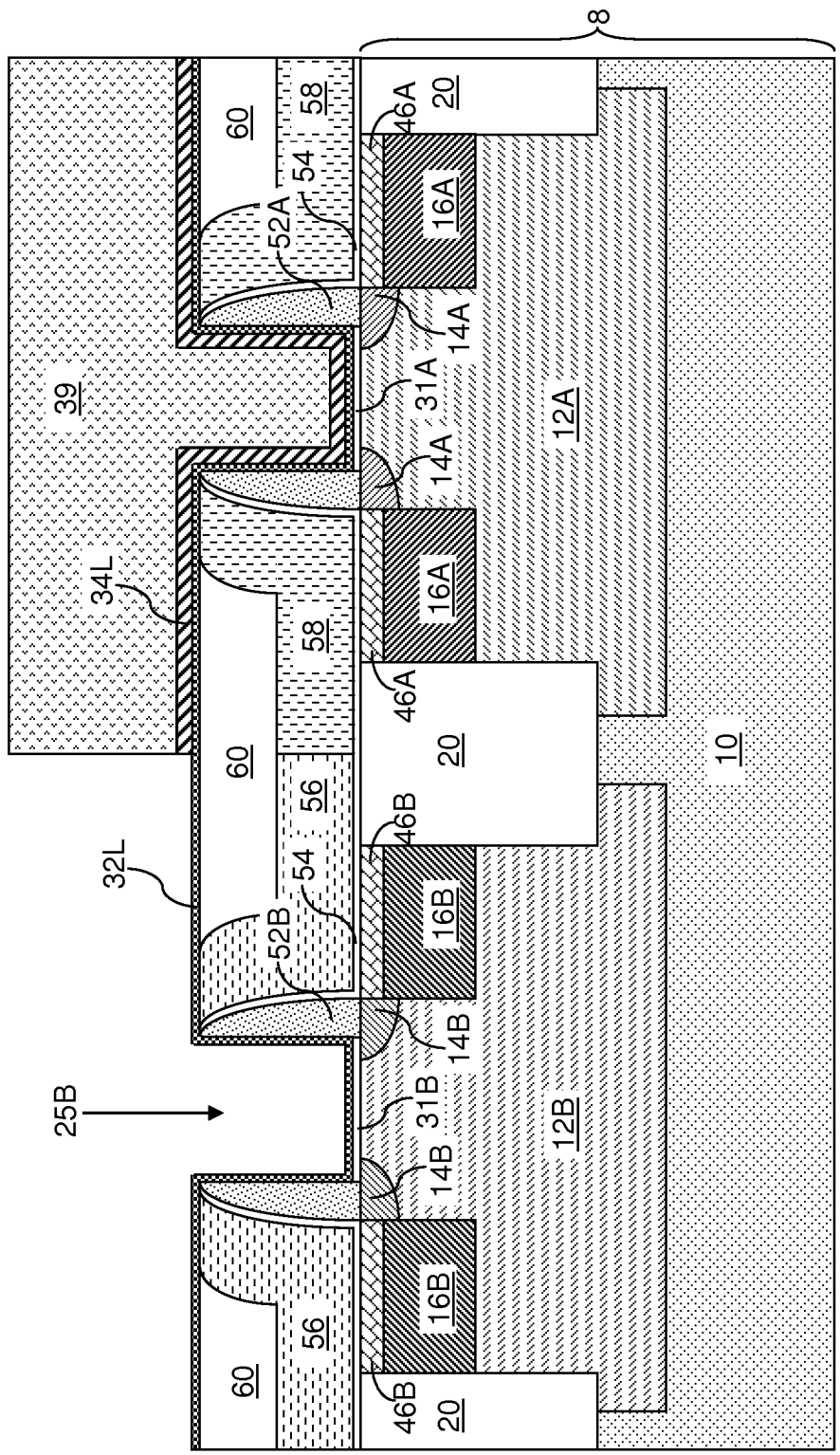
FIG. 4 is a vertical cross-sectional view of the exemplary semiconductor structure of FIG. 3 after application of a photoresist and lithographic patterning of the first-type work function material layer.

Referring to FIG. 4, a first photoresist 39 is applied and lithographic patterned so that the first photoresist 39 covers the area over the second conductivity type well 12A, while the top surface of the first-type work function metal layer 34L is exposed over the first conductivity type well 12B. The pattern in the first photoresist 39 is transferred into the first-type work function metal layer 34L by an etch. The portion of the first-type work function metal layer 34L within the second gate cavity 25B is removed employing the first photoresist 39 as an etch mask. The first photoresist 39 is removed, for example, by ashing or wet etching. After the patterning of the first-type work function metal layer 34L, the first-type work function metal layer 34L is present in the first gate cavity 25A (See FIG. 4), but is not present in the second gate cavity 25B.

Figure 5:
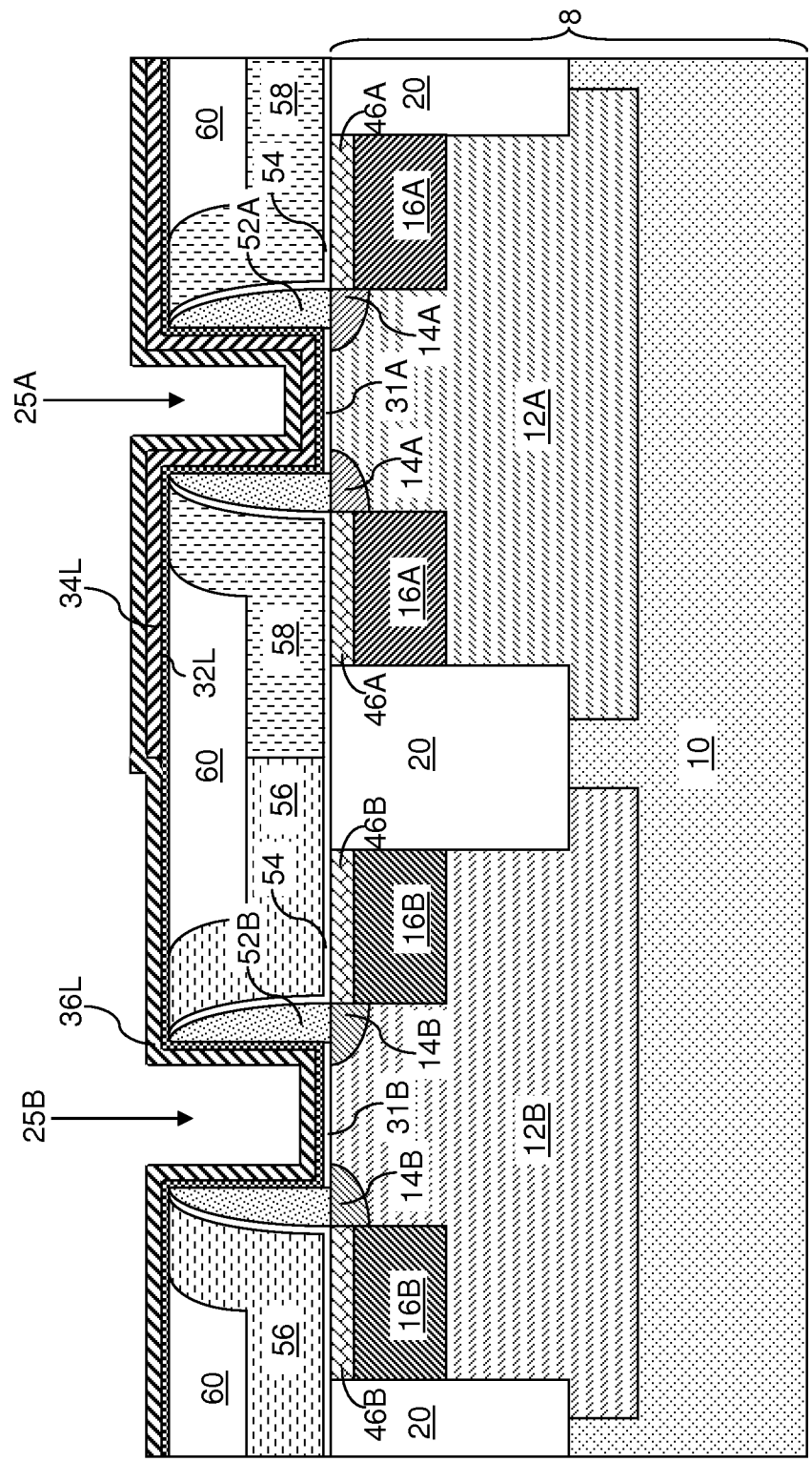
FIG. 5 is a vertical cross-sectional view of the exemplary semiconductor structure of FIG. 4 after removal of the photoresist and formation of a second-type work function material layer.

Referring to FIG. 5, a second-type work function metal layer 36L is deposited. The second-type work function metal layer 36L includes a second metal having a second work function, which is different from the first work function. The second metal of the second-type work function metal layer 36L is selected to optimize the performance of a transistor to be subsequently formed employing the second source and drain extension regions 14B, the second source and drain regions 16B, and the first conductivity type well 12B.

In one embodiment, the second conductivity type is n-type and the semiconductor material of the first conductivity type well 12B includes p-doped silicon, and the second-type work function metal layer 36L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second-type work function metal layer 36L can be a layer of TiAl.

In another embodiment, the second conductivity type is p-type and the semiconductor material of the first conductivity type well 12B includes n-doped silicon, and the second-type work function metal layer 36L includes a silicon valence band edge metals such as Pt, Rh, Ir, Ru, Cu, Os, Be, Co, Pd, Te, Cr, Ni, TiN, and alloys thereof. For example, the second-type work function metal layer 36L can be a layer of TiN.

The second-type work function metal layer 36L can be formed, for example, by physical vapor deposition, chemical vapor deposition, or atomic layer deposition (ALD). The thickness of the second-type work function metal layer 34L is typically set at a value from 2 nm to 100 nm, and more typically, from 3 nm to 10 nm, although lesser and greater thicknesses can also be employed.

In general, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

Figure 6:
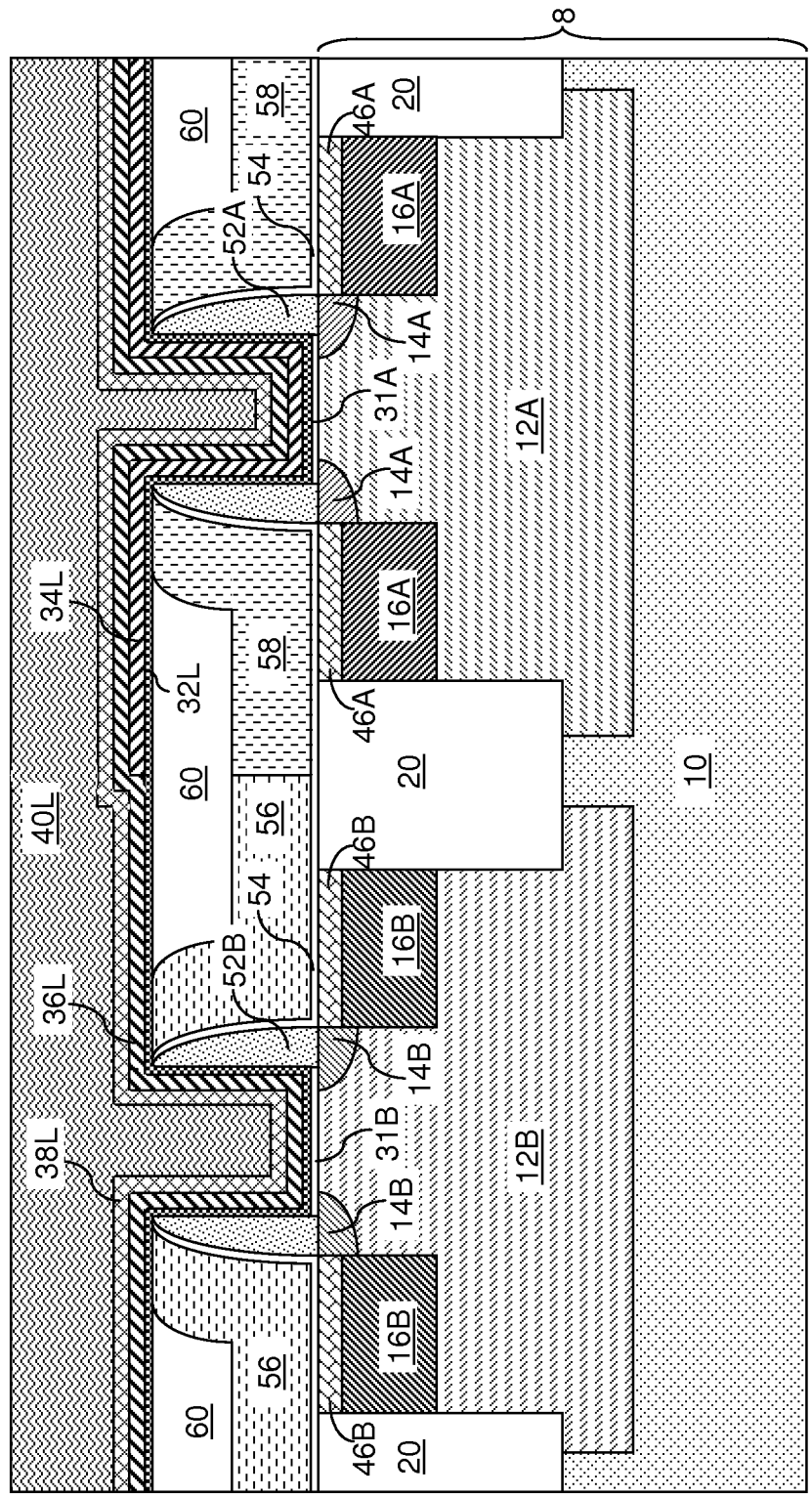
FIG. 6 is a vertical cross-sectional view of the exemplary semiconductor structure of FIG. 5 after deposition of at least one metallic barrier layer and a conductive metal layer.

Referring to FIG. 6, an optional barrier metal layer 38L can deposited on the second-type work function metal layer 36L. In a non-limiting illustrative example, the optional barrier metal layer 38L can include a tantalum nitride layer, a titanium nitride layer, a titanium-aluminum alloy, or a combination thereof. The thickness of the optional barrier metal layer 38L can be from 0.5 nm to 20 nm, although lesser and greater thicknesses can also be employed. The optional barrier metal layer 38L may be omitted in some embodiments. In one embodiment, the optional barrier metal layer 38L includes a metallic nitride. For example, the optional barrier metal layer 38L can include titanium nitride.

A conductive metal layer 40L is deposited on the optional barrier metal layer 38L or on the second-type work function metal layer 36L. The conductive metal layer 40L can include a conductive material deposited by physical vapor deposition or chemical vapor deposition. For example, the conductive metal layer 40L can be an aluminum layer or an aluminum alloy layer deposited by physical vapor deposition. The thickness of the conductive metal layer 40L, as measured in a planar region of the conductive metal layer 40L above the top surface of the planarization dielectric layer 60, can be from 100 nm to 500 nm, although lesser and greater thicknesses can also be employed. In one embodiment, the conductive metal layer 40 consists essentially of a single elemental metal such as Al, Au, Ag, Cu, or W. For example, the conductive metal layer can consist essentially of aluminum.

At the end of the processing step of FIG. 6, a material layer stack is formed, which includes, from bottom to top, the contiguous gate dielectric layer 32L which is a gate dielectric layer, the first-type work function metal layer 34L, the second-type work function metal layer 36L, the optional barrier metal layer 38L, if present, and the conductive metal layer 40L. The portion of the material layer stack in the first device region includes the first-type work function metal layer 34L and a portion of the second-type work function metal layer 36L. The portion of the material layer stack in the second device region includes another portion of the second-type work function metal layer 36L, but does not include any portion of the first-type work function metal layer 34L. The material layer stack is present over the top surface of the planarization dielectric layer 60 at this step.

Figure 7:
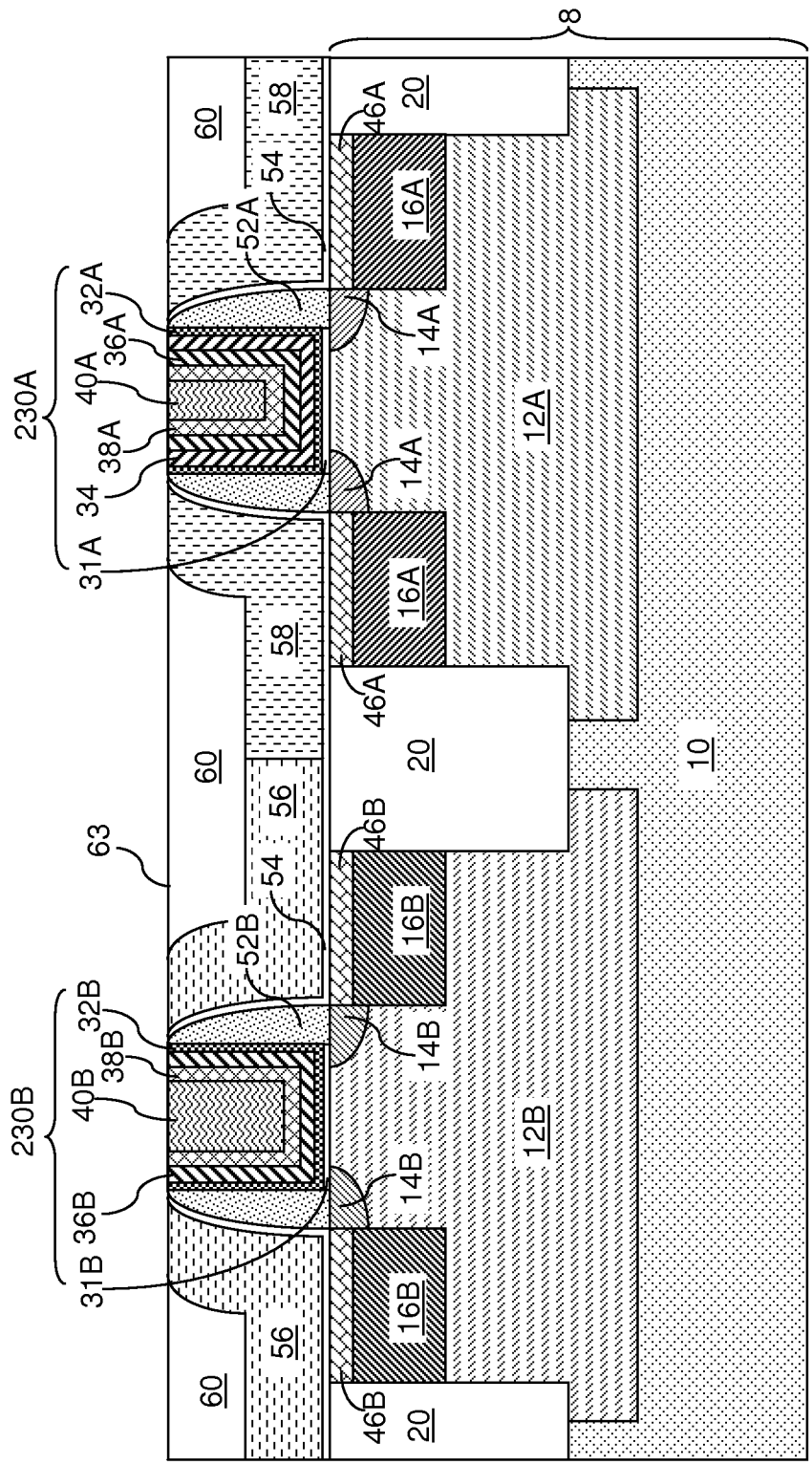
FIG. 7 is a vertical cross-sectional view of the exemplary semiconductor structure of FIG. 6 after planarization.

Referring to FIG. 7, portions of the gate conductor layer 40L, the optional barrier metal layer 38L, the second-type work function metal layer 36L, the first-type work function metal layer 34L, and the contiguous gate dielectric layer 32L are removed from above the planar dielectric surface 63 of the planarization dielectric layer 60 by employing a planarization process. Replacement gate stacks are formed by removing portions of the material layer stack from above a source region and a drain region of each field effect transistor. The replacement gate stacks include a first replacement gate stack 230A located in the first device region and a second replacement gate stack 230B located in the second device region. Each replacement gate stack (230A, 230B) overlies a channel region of a field effect transistor. The first replacement gate stack 230A and the second replacement gate stack 230B are formed concurrently.

A first field effect transistor is formed in the first device region. The first field effect transistor includes the p-type well 12A, the first source and drain extension regions 14A, the first source and drain regions 16A, first metal semiconductor alloy portions 46A, and a first replacement gate stack 230A. The first replacement gate stack 230A includes the optional first semiconductor-element-containing dielectric layer 31A, a first U-shaped gate dielectric 32A which is a remaining portion of the contiguous gate dielectric layer 32L in the first device region, and a first gate electrode. The first gate electrode includes a first-type work function metal portion 34 which is a remaining portion of the first-type work function metal layer 34L, a metallic material portion 36A which is a remaining portion of the second-type work function metal layer 36L in the first device region, a first optional barrier metal portion 38A which is a remaining portion of the optional barrier metal layer 38L, and a first gate conductor portion 40A which is a remaining portion of the gate conductor layer 40L.

A second field effect transistor is formed in the second device region. The second field effect transistor includes the n-type well 12B, the n-type source and drain extension regions 14B, the n-type source and drain regions 16B, a second metal semiconductor alloy portions 46B, and a second replacement gate stack 230B. The second replacement gate stack 230B includes the optional second semiconductor-element-containing dielectric layer 31B, a second U-shaped gate dielectric 32B which is a remaining portion of the contiguous gate dielectric layer 32L in the second device region, and a second gate electrode. The second gate electrode includes a second-type work function metal portion 36B which is a remaining portion of the second-type work function metal layer 36L in the second device region, a second optional barrier metal portion 38B which is a remaining portion of the optional barrier metal layer 38L, and a second gate conductor portion 40B which is a remaining portion of the gate conductor layer 40L. The metallic material portion 36A in the first replacement gate stack 230A and the second-type work function metal portion 36B in the second replacement gate stack 230B have the same material composition and the same thickness.

Each of the first and second U-shaped gate dielectrics (32A, 32B) has a dielectric constant greater than 8.0. Each of the first and second U-shaped gate dielectrics (32A, 32B) includes a horizontal gate dielectric portion and a vertical gate dielectric portion extending upward from peripheral regions of the horizontal gate dielectric portion. In the first field effect transistor, the first-type work function metal portion 34 contacts inner sidewalls of the vertical gate dielectric portion of the first U-shaped gate dielectric 32A. In the second field effect transistor, the second-type work function metal portion 36B contacts inner sidewalls of the vertical gate dielectric portion of the second U-shaped gate dielectric 32B.

All top metallic surfaces of each of the first gate electrode 220A and the second gate electrode 220B can be coplanar with the top surface of the planarization dielectric layer 60, i.e., the planar dielectric surface 63. The disposable gate structures are replaced with the first and second replacement gate structures (230A, 230B) each including a gate dielectric (32A, 32B) and a gate electrode including at least one conductive material portion. Each gate electrode is a remaining portion of the at least one conductive material after removing the at least one conductive material from above a top surface of the planarization dielectric layer. A dielectric gate spacer (52A or 52B) laterally surrounds each gate electrode.

Figure 8:
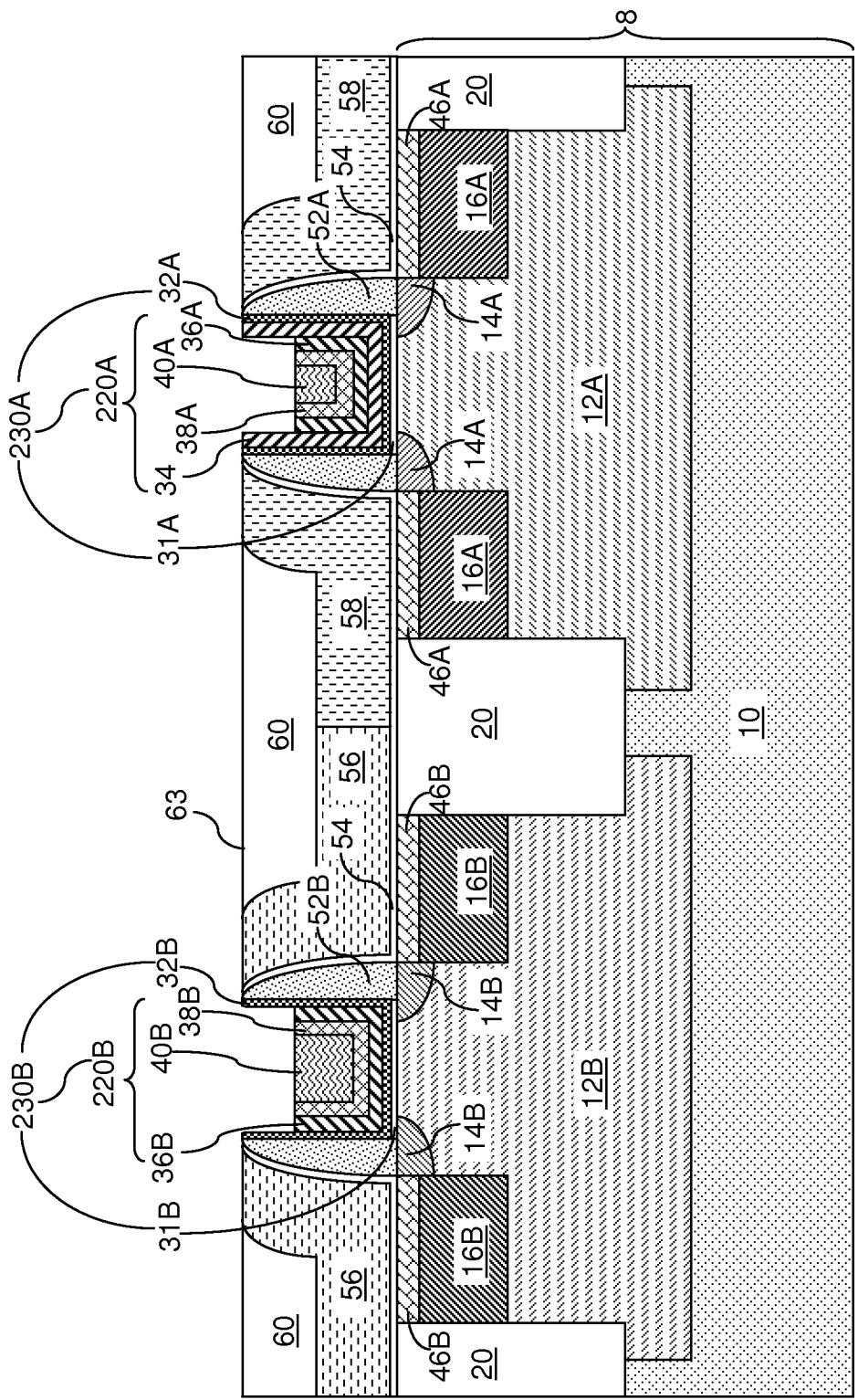
FIG. 8 is a vertical cross-sectional view of the exemplary semiconductor structure of FIG. 7 after recessing an upper portion of a gate electrode by at least one wet etch.

Referring to FIG. 8, the upper portions of the first gate electrode 220A and the second gate electrode 220B are exposed to at least one etch so that the top surfaces of the first gate electrode 220A and the second gate electrode 220B are recessed relative to the top surface of the planarization dielectric layer 60. The at least one etch can include one or more wet etches only, one or more dry etches only, or a combination of at least one wet etch and at least one dry etch. As used herein, a "wet etch" is an etch in which an etchant liquid is applied to a material to be etched, and a "dry etch" is an etch in which a gas phase etchant or a plasma phase etchant is applied to a material to be etched.

At least one wet etch can be employed to remove one or more conductive material from the first gate electrode 220A and the second gate electrode 220B. In an exemplary illustration, the at least one conductive material in each of the first gate electrode 220A and the second gate electrode 220B can include a titanium nitride portion and an aluminum portion. For example, if the second-type work function metal layer 36L includes titanium nitride, the metallic material portion 36A in the first replacement gate structure 230A and the second-type work function metal portion 36B in the second replacement gate structure 230B also include titanium nitride. In this case, a wet etch solution including ammonium hydroxide and hydrogen peroxide can be employed to etch the titanium nitride portions, viz., the metallic material portion 36A and the second-type work function metal portion 36B. The wet etch solution including ammonium hydroxide and hydrogen peroxide may, or may not, be diluted in water.

In another example, the gate conductor layer 40L can be an aluminum layer, and each of the first gate conductor portion 40A and the second gate conductor portion 40B can be an aluminum portion. In this case, the first gate conductor portion 40A and the second gate conductor portion 40B can be etched by another wet etch that employs a sulfuric peroxide-containing solution and/or a dilute hydrofluoric acid-containing solution. Specifically, the wet etch can employ a solution including at least sulfuric acid and hydrogen peroxide or a dilute hydrofluoric acid-containing solution. The sulfuric peroxide-containing solution can be a diluted sulfuric peroxide solution or a mixture of a diluted sulfuric peroxide solution and hydrofluoric acid at a concentration between 1 ppm and 100 ppm or a mixture, diluted in water, of sulfuric peroxide solution, hydrogen peroxide, and hydrofluoric acid at a concentration between 1 ppm and 100 ppm.

In one embodiment, the upper portions of the at least one conductive material of the first gate electrode 220A and the second gate electrode 220B can be recessed by a combination of a wet etch and a dry etch. For example, if a wet etch or a combination of wet etches does not effective remove all types of conductive materials in the first gate electrode 220A and the second gate electrode 220B, one or more dry etch process can be employed to remove any protruding portion of the first gate electrode 220A and the second gate electrode 220B. For example, tantalum nitride portions are known to be difficult to remove employing wet etch chemistries. Thus, if any of the conductive material portions in the first gate electrode 220A and the second gate electrode 220B is a tantalum nitride portion, such a tantalum nitride portion may protrude above recessed top surfaces of other conductive materials after one or more wet etches are performed. This situation is illustrated in FIG. 8 for a non-limiting illustrative case in which the first-type work function metal portion 34 is a tantalum nitride portion or a metallic material portion including a metallic material that cannot be easily etched employing wet etch chemistries.

Figure 9:
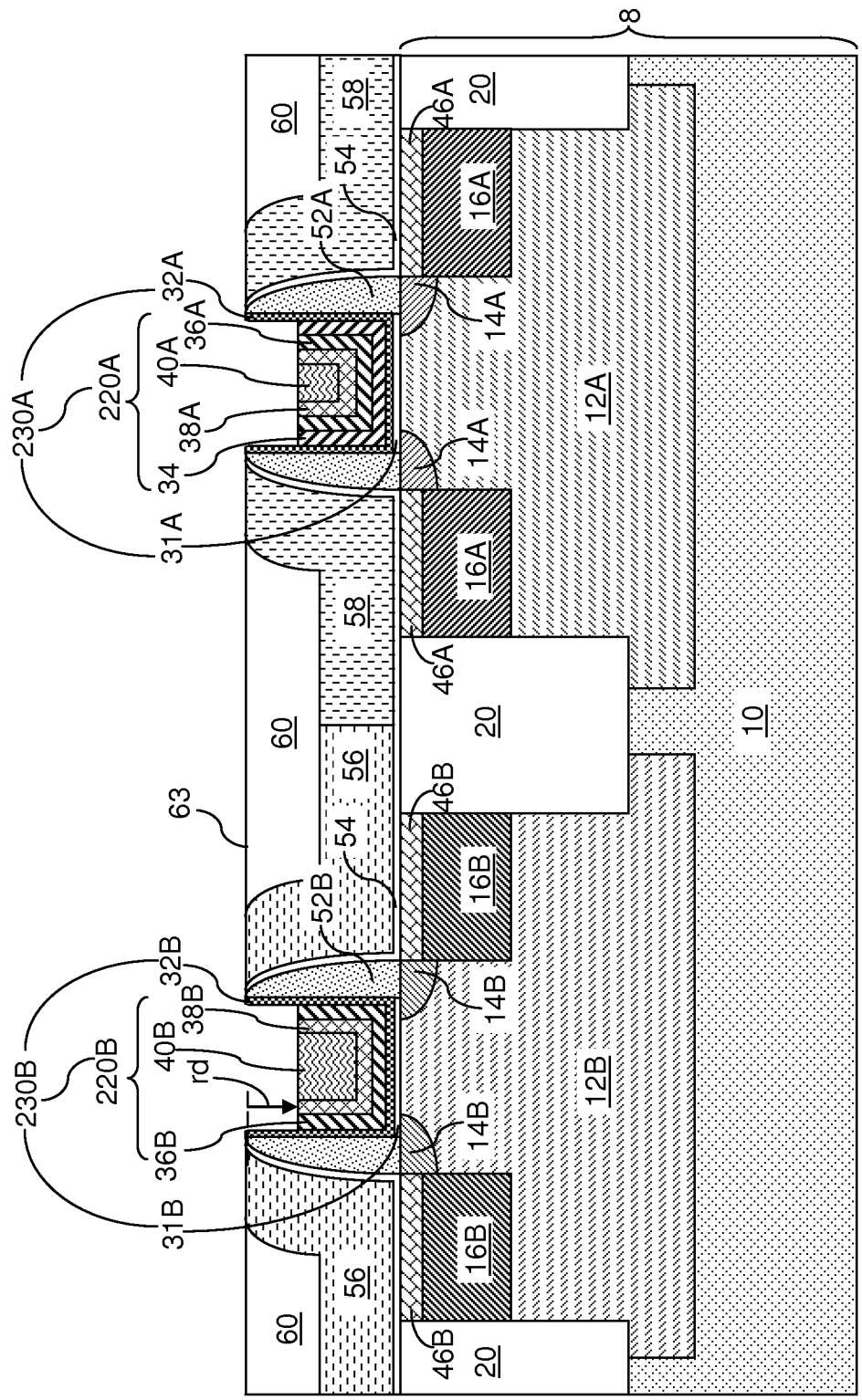
FIG. 9 is a vertical cross-sectional view of the exemplary semiconductor structure of FIG. 8 after removing protruding portions of gate electrodes by a dry etch.

Referring to FIG. 9, a dry etch can be employed to remove any protruding conductive material portion of the first gate electrode 220A and the second gate electrode 220B that is not recessed by one or more wet etches. Such a protruding conductive material portion, which can be a tantalum nitride portion or a titanium nitride portion, can be removed by a dry etch. In one embodiment, plasma damage to gate dielectrics (e.g., the first gate dielectric (31A, 32A) and the second gate dielectric (32B, 32B)) can be avoided by employing a dry etch that does not apply plasma to the first and second replacement gate stacks (230A, 230B). For example, one or more protruding conductive material portion in the first gate electrode 220A or the second gate electrode 220B can be removed by a chemical downstream etch that does not apply plasma to the gate stack.

A chemical downstream etch (CDE) differs from reactive ion etch (RIE) or plasma etch (PE) in that chemical downstream etch performs an etch isotropically, i.e., at the same etch rate in all directions. In a chemical downstream etch, a plasma is generated in a radical generator located outside a process chamber in which the exemplary semiconductor structure is placed. Only radicals can get out of this radical generator while the ions remain trapped inside the radical generator. The processes gases are dissociated in the radical generator and distributed equally in the process chamber in which the exemplary semiconductor structure is present. This geometry causes equal removal from all surfaces exposed to the radicals, thereby causing isotropic etching. Thus, protruding conductive material portions in the first gate electrode 220A and the second gate electrode 220B can be removed by a chemical downstream etch isotropically. A chemical downstream etch can remove metal oxides that are difficult to remove by wet etches. Etchant gases that can be used for CDE include, but are not limited to, $CHF_3$ and $CF_4$, which are especially effective for metals such as Ta or Ti. $Cl_2$ gas can also be employed as an etchant gas in a CDE process. Specifically, the at least one conductive material in the one or more protruding conductive material portion in the first gate electrode 220A or the second gate electrode 220B can include at least a tantalum nitride portion or a titanium nitride portion. The CDE can etch at least one tantalum nitride portion or at least one titanium nitride portion. The CDE can employ at least one of $CHF_3$, $CF_4$, and $Cl_2$ and does not generate plasma in the process chamber, and consequently does not generate any plasma directly on any gate stack, and thereby preventing plasma damage of gate dielectric materials.

The combination of the at least one wet etch and at least one dry etch can be employed to recess all conductive top surfaces of the first gate electrode 220A and the second gate electrode 220B. Substantially flat recessed top surfaces can be formed on the first gate electrode 220A and the second gate electrode 220B. After removing all protruding portions of gate electrodes by at least one dry etch, top surfaces of the first gate electrode 220A and the second gate electrode 220B are recessed relative to the top surface of the planarization dielectric layer 60. The depth of the recess, i.e., the recess depth rd, can be from 3 nm to 30 nm, and typically, from 5 nm to 10 nm, although lesser and greater recess depths can also be employed.

In one embodiment, the exposed portions of the first semiconductor-element-containing dielectric layer 31A can be formed on the exposed surface of the second conductivity type well 12A by conversion of the exposed semiconductor material into a dielectric material, and a second semiconductor-element-containing dielectric layer 31B.

Optionally, a mask layer (not shown) can also be used to define regions in which at least one gate electrode (220A and/or 220B) is to be recessed, thereby limiting formation of recesses within a predefined area that is less than the entire area of a semiconductor circuit structure. Such an areal limitation on formation of the recesses can be effected by employing a hard mask (including a dielectric material such as silicon oxide, silicon nitride, organosilicate glass, or a combination thereof) or a soft mask (a photoresist). The hard mask or the soft mask can be removed after patterning of the recesses in desired areas. For example, another gate electrode (not shown) can be formed concurrently with formation of the first and second gate electrodes (220A, 220B) on the semiconductor substrate 8 such that a top metallic surface of the other gate electrode is coplanar with the top surface of the planarization dielectric layer 60. Subsequently, the other gate electrode is covered with a patterned mask layer, which does not overlie, i.e., does not cover, the first and second gate electrodes (220A, 220B). Thus, the other gate electrode is not recessed while the top surfaces of the first and second gate electrodes (220A, 220B) is recessed relative to the top surface of the planarization dielectric layer 60. A plurality of other gate electrodes (not shown) can be formed and covered by the patterned mask layer to prevent recessing. The patterned mask layer is subsequently removed, for example, by a dry etch or a wet etch or ashing. In some cases where a hard mask is employed, the hard mask could be kept in place.

Figure 10:
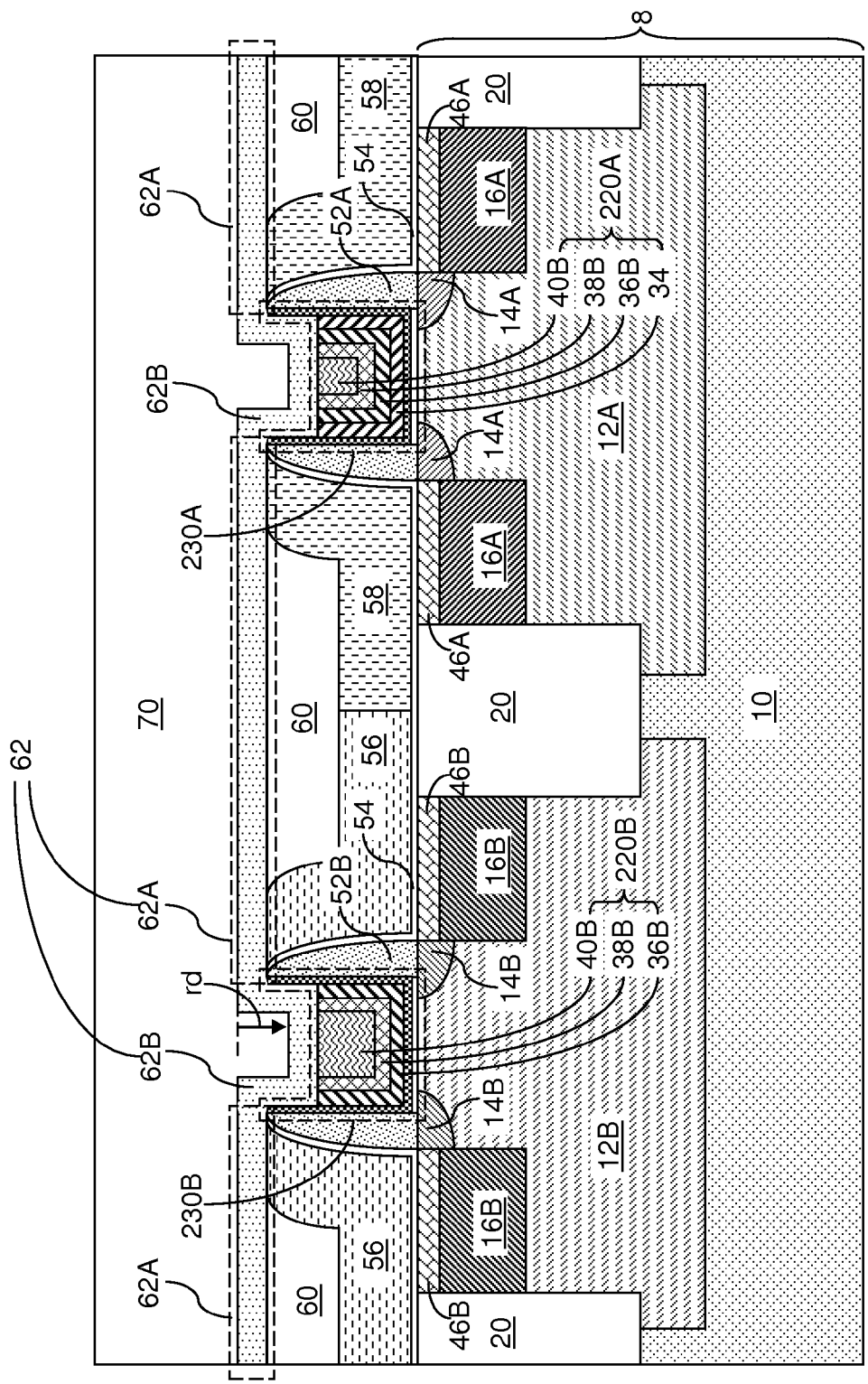
FIG. 10 is a vertical cross-sectional view of the exemplary semiconductor structure of FIG. 9 after formation of an etch stop dielectric layer and a contact-level dielectric layer.

Referring to FIG. 10, an etch stop dielectric layer 62 is formed contiguously on the recessed top surface of the first gate electrode 220A and the second gate electrode 220B and on the top surface of the planarization dielectric layer 60. The etch stop layer 62 includes a first portion 62A formed on the planarization dielectric layer 60 and second portions 62B formed on the first and second gate electrodes (220A, 220B). Each of the second portions 62B has a vertically offset bottom surface relative to an interface between the planarization dielectric layer 60 and the first portion 62A, i.e., the top surface of the planarization dielectric layer 60. The vertical offset distance is the same as the recess depth rd.

The etch stop layer 62 can be formed by a conformal deposition, such as chemical vapor deposition (CVD), of a dielectric material that has a different composition than the planarization dielectric layer 60 and a contact-level dielectric layer to be subsequently deposited thereupon. In one embodiment, the etch stop layer 62 includes a material having a chemical composition of $SiC_xO_yH_z$ (also known as organosilicate glass), $SiN_wC_xO_yH_z$ (i.e., nitrogen-doped organosilicate glass), $SiC_xH_z$ (also known as BLoK™), or $SiN_wC_xH_z$ (also known as NBLoK™), wherein each of w, x, y, and z independently has a value greater than 0 and less than 0.75. The thickness of the etch stop layer 62 can be from 5 nm to 100 nm, and typically from 10 nm to 50 nm, although lesser and greater thicknesses can also be employed.

The first portion 62A and a center region of each second portion 62B of the etch stop layer 62 have a same composition and a same thickness. The vertical recess over the first and second gate electrodes (220A, 220B) cause a peripheral region of each second portion 62B to have sidewalls that are vertically coincident with sidewalls of a gate electrode (220A or 220B). The peripheral portion of each second portion 62B extends from a level coplanar with a bottom surface of the center region of the second portion 6B to a level coplanar with a top surface of the first portion 62A.

A contact-level dielectric layer 70 is deposited over the etch stop layer 62. The contact-level dielectric layer 70 can be formed by depositing a dielectric material, which is different from the dielectric material of the etch stop layer 62. The dielectric material of the contact-level dielectric layer 70 can be selected, for example, from undoped silicate glass (USG), doped silicate glass, silicon nitride, organosilicate glass (OSG), undoped silicon oxynitride, and doped silicon oxynitride. If the contact-level dielectric layer 70 includes an organosilicate glass and the etch stop layer 62 includes another organosilicate glass, the compositions of the contact-level dielectric layer 70 and the etch stop layer 62 differ so that the material of the contact-level dielectric layer 70 can be etched selective to the material of the etch stop layer 62. The thickness of the contact-level dielectric layer 70 can be from 30 nm to 300 nm, although lesser and greater thicknesses can also be employed. Optionally, the contact-level dielectric layer 70 can be polished in a planarization processing step to facilitate subsequent formation of metal interconnect structures such as contact vias and metal lines thereupon and/or to control the thickness of the contact-level dielectric layer 70 within a predetermined target range.

Figure 11:
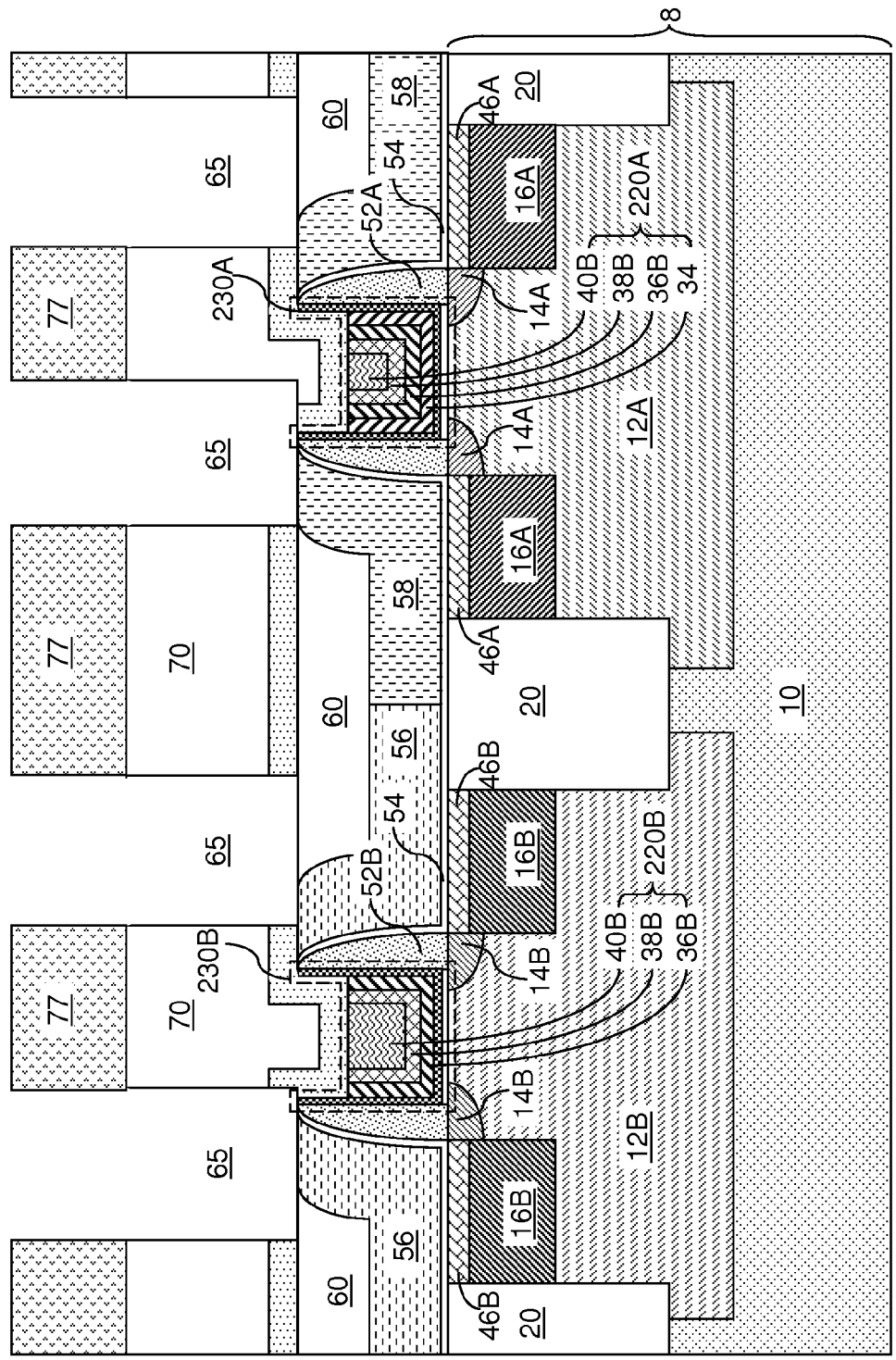
FIG. 11 is a vertical cross-sectional view of the exemplary semiconductor structure of FIG. 10 during formation of self-aligned via holes.

Referring to FIG. 11, a photoresist 77 is applied over the contact-level dielectric layer 70 and lithographically patterned to form a pattern of via holes overlying contact regions of exemplary semiconductor structure. The contact regions may include source and/or drain regions of the first and second field effect transistor. In some cases, overlay variations inherent in all lithography processes may cause peripheral regions of via holes in the pattern within the photoresist 77 to overlie a portion of a gate electrode (220A and/or 220B) despite the condition that the intended contact areas are regions located on the top surface of the semiconductor substrate 8, such as the metal semiconductor alloy portions (46A, 46B).

The pattern in the photoresist 77 is transferred into the contact-level dielectric layer 70 and subsequently into the etch stop layer 62 by at least one etch that employs the photoresist 77 as an etch mask to form via holes 65. For example, a first reactive ion etch that etches the dielectric material of the contact-level dielectric layer 70 selective to the dielectric material of the etch stop layer 62 can be employed to transfer the pattern in the photoresist 77 through the contact-level dielectric layer 70. This segment of the etch process automatically stops on the topmost surface of the etch stop layer 62 due to the selectivity to the material of the etch stop layer 62. Further, the exposure of surfaces of the etch stop layer 62 can be detected, for example, employing an end point detection scheme that detects the change in composition of residual gases in the process chamber.

Upon detection of the end point for the etching of the contact-level dielectric layer 70, the etch chemistry of the etch process can be changed so that the dielectric material of the etch stop layer 62 is etched within the via holes 65. The etch stop layer 62 is etched through underneath the via holes 65 in areas overlying the planarization dielectric layer 60, the first type stress-generating liner 58, and/or the second type stress-generating liner 56, viz. in areas of the first portion 62A (See FIG. 10). Because the upper surfaces of the etch stop layer 62 are vertically recessed by the recess depth rd (See FIG. 10) in areas overlying a center portion of each gate electrode (220A, 220B), however, the recessed upper surfaces of the etch stop layer 62 are not exposed even after the etch stop layer 62 is etched through in areas overlying the planarization dielectric layer 60, the first type stress-generating liner 58, and/or the second type stress-generating liner 56.

Figure 12:
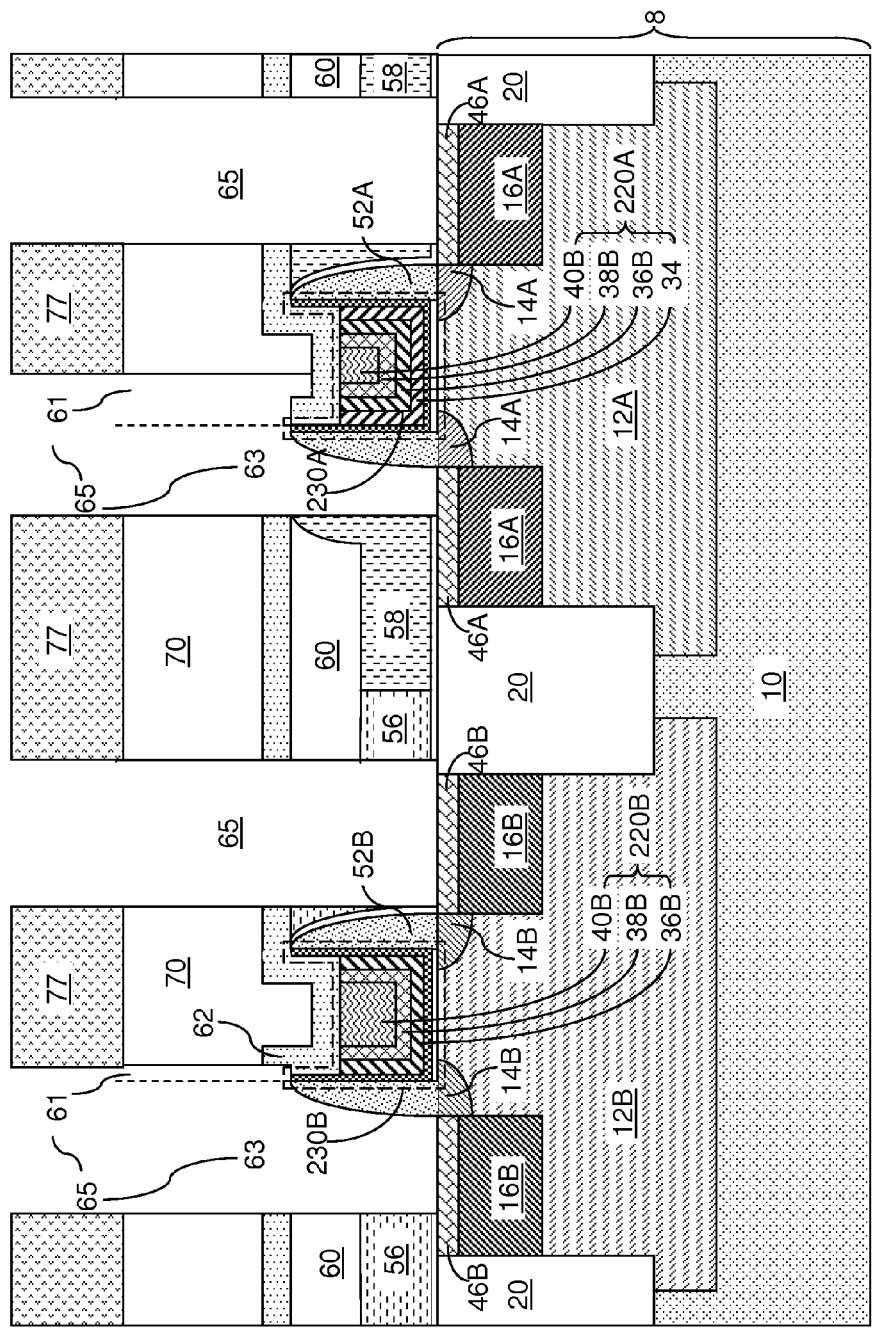
FIG. 12 is a vertical cross-sectional view of the exemplary semiconductor structure of FIG. 11 after formation of the self-aligned via holes.

Referring to FIG. 12, an additional etch process is performed to extend the via holes 65 through the planarization dielectric layer 60, the first type stress-generating liner 58, and/or the second type stress-generating liner 56. The etch chemistry for the additional etch process is selected so that this etch is selective to the dielectric materials of the etch stop layer 62 and the first and second dielectric gate spacers (52A, 52B). Because of the selectivity of this etch chemistry to the dielectric material of the etch stop layer 62, the via hole 65 does not extend through the portions of the etch stop layer 62 overlying the first and second gate electrodes (220A, 220B). Further, because of the selectivity of this etch chemistry to the dielectric material of the first and second dielectric gate spacers (52A, 52B), the via hole 65 does not expose the sidewalls of the first and second replacement gate structures (230A, 230B).

At the end of this etch, the via holes 65 do not vertically extend below the top surfaces of the remaining portions of the etch stop layer 62 that overlie the first or second gate electrode (220A or 220B) because of the vertical offset between the first portion 62A and the second portions 62B (See FIG. 10). Further, the via holes 65 do not laterally extend beyond outer surfaces of the first and second dielectric gate spacers (52A, 52B). Thus, the via hole 65 at the end of this etch are self-aligned via holes, which are vertically self-aligned to a top surface of the remaining portions of the etch stop layer 62 overlying the first and second gate electrodes (220A, 220B), and laterally self-aligned to the outer surfaces of the first and second dielectric gate spacers (52A, 52B).

The original pattern in the photoresist 77 is modified by the shapes of the first and second replacement gate structures (230A, 230B) and the first and second dielectric gate spacers (52A, 52B). Some of the via holes 65 can include a first via hole portion 63 that does not overlie any gate electrode (220A, 220B) and a second via hole portion 61 that overlies a gate electrode (220A, 220B). For each such via hole 65, the first and second via hole portions (63, 61) are contiguously connected to each other. For each via hole 65 that overlies a portion of the first and second replacement gate structures (230A, 230B), a first portion 61 of the via hole 65 does not extend below a recessed portion of the etch stop layer 62 that overlies a gate electrode (220A, 220B). For such via holes 65, a second portion 63 of the via hole 65 extends into the planarization dielectric layer 60 (and the first type stress-generating liner 58 and/or the second type stress-generating liner 56, if present) where the first and second gate electrodes (220A, 220B) and the first and second dielectric gate spacers (52A, 52B) are not present. The second portion 63 of such a via hole 65 can extend to a top surface of the semiconductor substrate 8, which can be a top surface of metal semiconductor alloy portions (46A, 46B). The photoresist 77 is subsequently removed, for example, by ashing.

Figure 13:
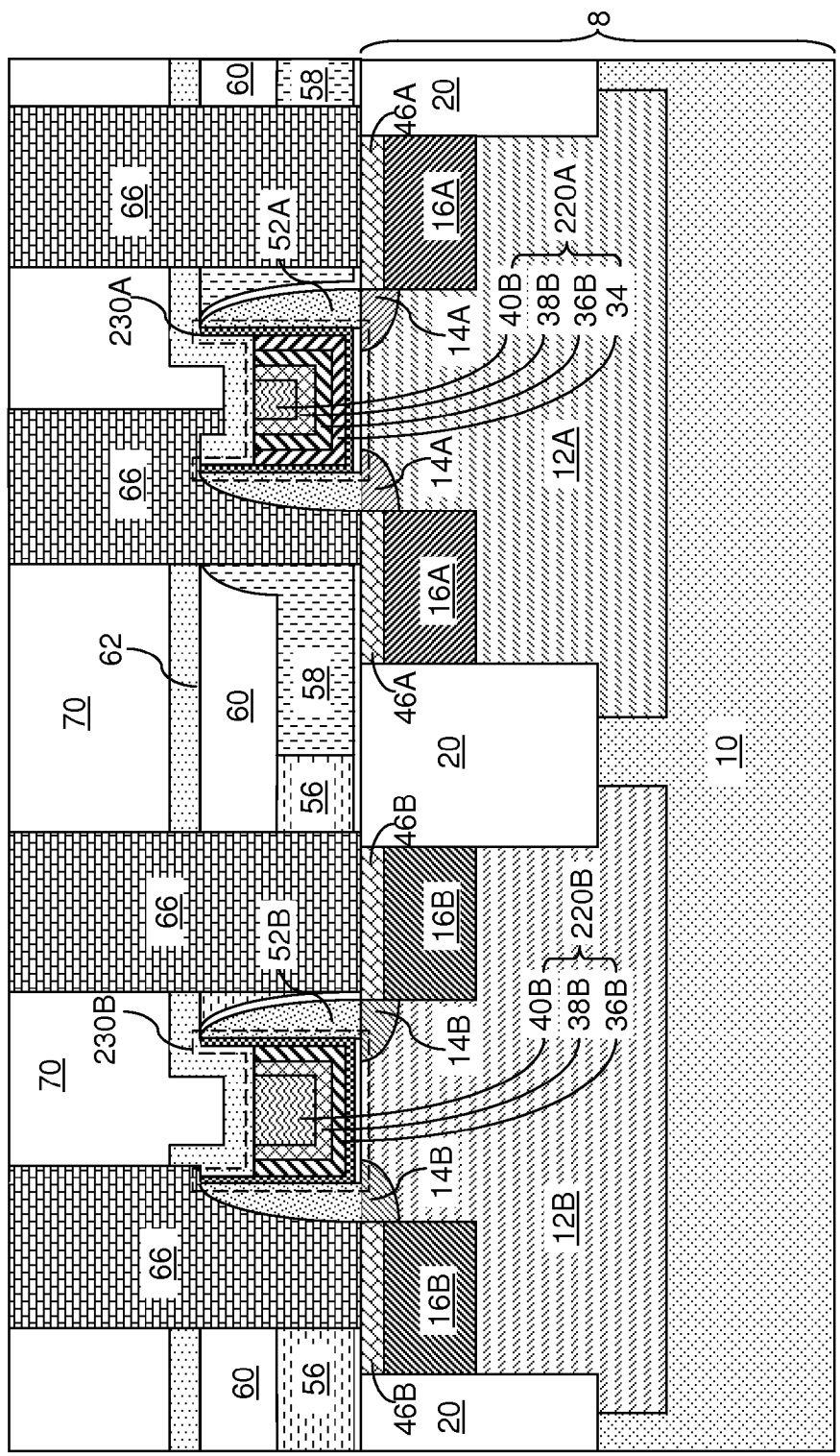
FIG. 13 is a vertical cross-sectional view of the exemplary semiconductor structure of FIG. 12 after formation of self-aligned contact via structures.

Referring to FIG. 13, self-aligned contact via structures 66 are formed by filling the via holes 65 with a conductive material and removing the portions of the conductive material deposited above the topmost surface of the contact-level dielectric material layer 70 by planarization employing, for example, chemical mechanical planarization and/or recess etch. The self-aligned contact via structures 66 extend through the contact-level dielectric layer 70, the etch stop layer 62, and the planarization dielectric layer 60, and if the first type stress-generating liner 58 and/or the second type stress-generating liner 56 is/are if present, through first type stress-generating liner 58 and/or the second type stress-generating liner 56. Each gate electrode (220A, 220B) is spaced from the self-aligned contact via structures 66 by a recessed portion of the etch stop layer 62 and a dielectric gate spacer (52A or 52B). Thus, overlay variations during the lithographic process that defines the pattern of the via holes 65 do not result in electrical shorts between the self-aligned contact via structures 66 and the gate electrodes (220A, 220B).

In case a portion of a self-aligned contact via structure 66 in the contact-level dielectric layer 70 overlies a gate electrode (220A or 220B), the self-aligned contact via structure 66 is vertically spaced from the gate electrode (220A or 220B) by a recessed portion of the etch stop layer 62. Thus, a portion of the self-aligned contact via structure 66 overlies the gate electrode (220A or 220B) and is vertically spaced from the gate electrode (220A, 220B) by the recessed portion of the etch stop layer 62.

Further, a lower portion of such a self-aligned contact via structure 66 is laterally spaced from the nearest gate electrode (220A or 220B) at least by a dielectric gate spacer (52A or 52B). Thus, each self-aligned contact via structure 66 is spaced from the nearest gate electrode (220A or 220B) by a recessed portion of the etch stop layer 62 and a dielectric gate spacer (52A or 52B). A dielectric gate spacer (52A or 52B) can laterally surround a gate electrode (220A, 220B) and can be laterally surrounded by the planarization dielectric layer 60. Each elf-aligned contact via structure 66 can be spaced from the gate electrode (220A, 220B) by the etch stop layer 62 and a dielectric gate spacer (52A or 52B). A U-shaped gate dielectric (32A, 32B; See FIG. 9) can contact a surface of the recessed portion of the etch stop layer 62.

Figure 14:
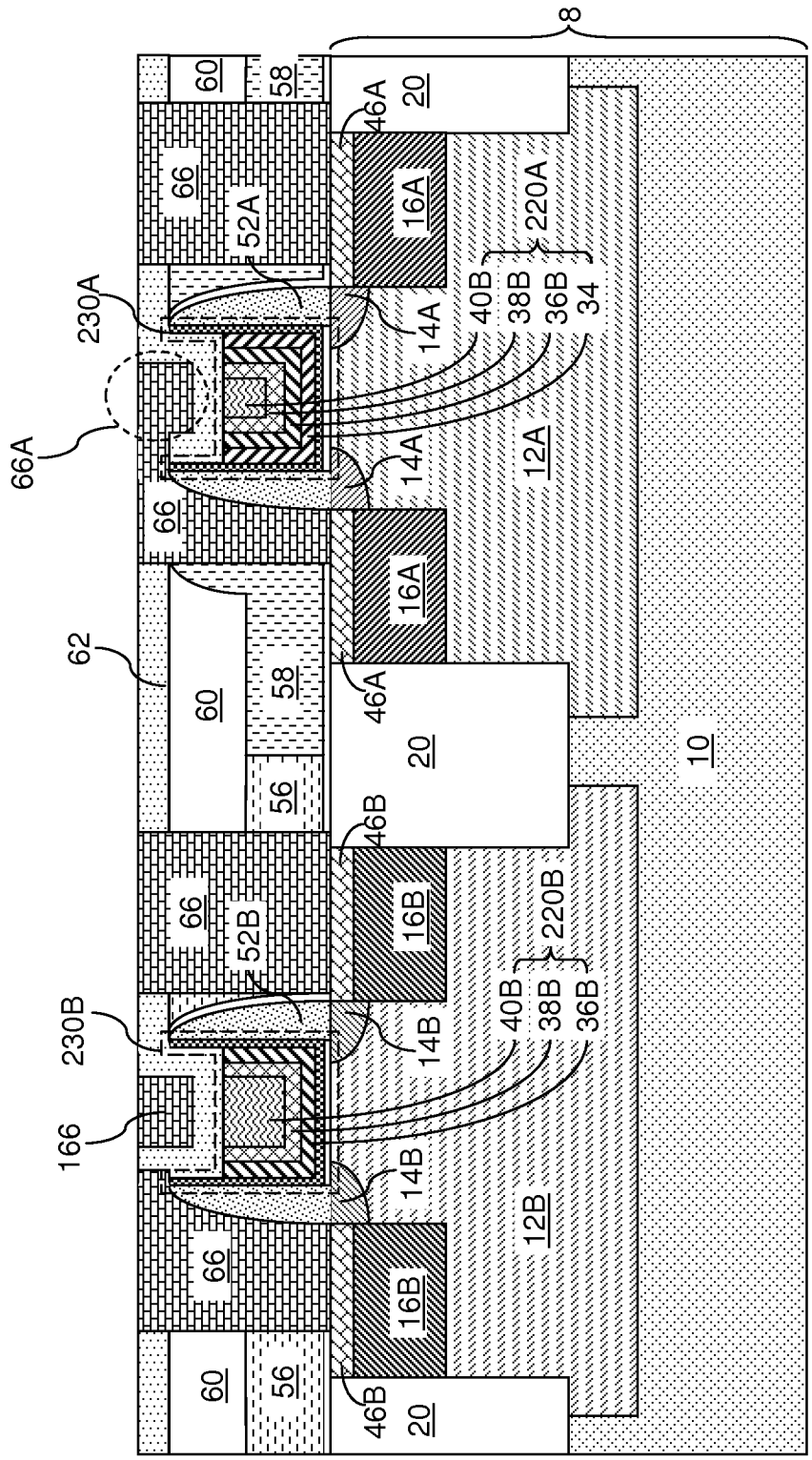
FIG. 14 is a vertical cross-sectional view of an alternate exemplary semiconductor structure after formation of self-aligned contact via structures.

Referring to FIG. 14, in an alternate embodiment, the formation of the contact-level dielectric material layer 70 can be omitted and the self-aligned contact via structures 66 can be directly patterned employing the combination of the etch stop layer 62 and a patterned photoresist 77 at processing steps of FIGS. 11 and 12. In this case, a plasma RIE chemistry can be employed to form the via holes 65, and self-aligned contact via structures 66 are formed by filling the via holes 65 with a conductive material and removing the portions of the conductive material deposited above the topmost surface of the etch stop layer 62 by planarization employing, for example, chemical mechanical planarization and/or recess etch. In this case, self-aligned contact via structures 66 are formed such that the topmost surfaces of the self-aligned contact via structures 66 are coplanar with the topmost surface of the etch stop layer 62. Depending on the overlay variations, electrically floating metal portions can be formed above a gate electrode (e.g., the second gate electrode 230B) and/or a self-aligned contact via structure 66 can include an overhanging portion 66A, which is an integral portion of the self-aligned contact via structure 66 and overhangs above a gate electrode (e.g., the first gate electrode 230A).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming a gate electrode and a planarization dielectric layer on a semiconductor substrate, wherein a top metallic surface of said gate electrode is coplanar with a top surface of said planarization dielectric layer;
    recessing a top surface of said gate electrode relative to said top surface of said planarization dielectric layer;
    forming an etch stop layer contiguously on said recessed top surface of said gate electrode and on said top surface of said planarization dielectric layer, wherein said etch stop layer includes a first portion located on said planarization dielectric layer and a second portion located on said gate electrode and having a vertically offset bottom surface relative to an interface between said planarization dielectric layer and said first portion;
    forming a contact-level dielectric layer over said etch stop layer;
    forming a via hole extending at least through said contact-level dielectric layer, said first portion of said etch stop layer, and a portion of said planarization dielectric layer, wherein said via hole is vertically spaced from said gate electrode by said second portion of said etch stop layer;
    wherein said gate electrode is a replacement gate electrode formed by:
        forming a disposable gate structure on said semiconductor substrate; and
        replacing said disposable gate structure with a gate dielectric and at least one conductive material, wherein said gate electrode is a remaining portion of said at least one conductive material after removing said at least one conductive material from above a top surface of said planarization dielectric layer.

2. The method of claim 1, wherein said etch stop layer is formed by a conformal deposition so that said first portion and a center region of said second portion of said etch stop layer have a same composition and a same thickness.

3. The method of claim 2, wherein said etch stop layer is formed so that a peripheral region of said second portion has sidewalls that are vertically coincident with sidewalls of said gate electrode, and extends from a level coplanar with a bottom surface of said center region of said second portion to a level coplanar with a top surface of said first portion.

4. The method of claim 1, wherein said etch stop layer is formed by depositing a dielectric material, wherein said dielectric material has a different composition than said contact-level dielectric layer and said planarization dielectric layer.

5. The method of claim 4, wherein said etch stop layer is formed by depositing a dielectric material having a chemical composition of $SiC_xO_yH_z$, $SiN_wC_xO_yH_z$, $SiC_xH_z$, or $SiN_wC_xH_z$, wherein each of w, x, y, and z independently has a value greater than 0 and less than 0.75.

6. The method of claim 5, wherein each of said contact-level dielectric layer and said planarization dielectric layer is formed by depositing a material selected from undoped silicate glass (USG), doped silicate glass, silicon nitride, organsilicate glass (OSG), undoped silicon oxynitride, and doped silicon oxynitride.

7. The method of claim 1, wherein said via hole includes a first via hole portion that does not overlie said gate electrode and a second via hole portion that overlies said gate electrode, and said first and second via hole portions are contiguously connected to each other.

8. The method of claim 1, further comprising forming a contact via structure by filling said via hole with a conductive material, wherein said gate electrode is spaced from said contact via structure by said etch stop layer and a dielectric gate spacer.

9. The method of claim 1, further comprising:
forming a dielectric gate spacer on sidewalls of said disposable gate structure; and
forming a contact via structure through said contact-level dielectric layer, said etch stop layer, and said planarization dielectric layer, wherein said contact via structure is spaced from said gate electrode by said etch stop layer and said dielectric gate spacer.

10. The method of claim 1, wherein said at least one conductive material includes at least a titanium nitride portion and an aluminum portion, and said method includes:
employing a wet etch solution including ammonium hydroxide and hydrogen peroxide to etch said titanium nitride portion; and
employing a solution including at least sulfuric acid and hydrogen peroxide or a dilute hydrofluoric acid-containing solution to etch said aluminum portion.

11. The method of claim 1, wherein said at least one conductive material includes at least a tantalum nitride portion or a titanium nitride portion, and said method includes employing a chemical downstream etch (CDE) to etch said tantalum nitride portion or said titanium nitride portion, wherein said CDE employs at least one of $CHF_3$, $CF_4$, and $Cl_2$ and does not generate plasma directly on said gate stack.

12. The method of claim 1, further comprising:
forming another gate electrode concurrently with formation of said gate electrode on said semiconductor substrate, wherein a top metallic surface of said other gate electrode is coplanar with said top surface of said planarization dielectric layer; and
covering said other gate electrode with a patterned mask layer, wherein said patterned mask layer does not overlie said gate electrode, and wherein said other gate electrode is not recessed while said top surface of said gate electrode is recessed relative to said top surface of said planarization dielectric layer.

* * * * *